United States Patent
Van Den Brin et al.

(10) Patent No.: US 12,416,868 B2
(45) Date of Patent: Sep. 16, 2025

(54) NON-CORRECTABLE ERROR IN METROLOGY

(71) Applicant: ASML NETHERLANDS B.V., Veldhoven (NL)

(72) Inventors: Arie Van Den Brin, Gemert (NL); Simon Hendrik Celine Van Gorp, Oud-Turnhout (BE)

(73) Assignee: ASML NETHERLANDS B.V., Veldhoven (NL)

( * ) Notice: Subject to any disclaimer, the term of this patent is extended or adjusted under 35 U.S.C. 154(b) by 810 days.

(21) Appl. No.: 17/623,931

(22) PCT Filed: Jun. 9, 2020

(86) PCT No.: PCT/EP2020/065916
§ 371 (c)(1),
(2) Date: Dec. 30, 2021

(87) PCT Pub. No.: WO2021/001119
PCT Pub. Date: Jan. 7, 2021

(65) Prior Publication Data
US 2022/0365450 A1    Nov. 17, 2022

(30) Foreign Application Priority Data

Jul. 4, 2019 (EP) .................................... 19184407
Aug. 28, 2019 (EP) .................................... 19193962

(51) Int. Cl.
*G03F 7/00* (2006.01)
*G03F 9/00* (2006.01)

(52) U.S. Cl.
CPC .... *G03F 7/70641* (2013.01); *G03F 7/706837* (2023.05); *G03F 9/7034* (2013.01)

(58) Field of Classification Search
CPC .......... G03F 7/70641; G03F 7/706837; G03F 9/7034
See application file for complete search history.

(56) References Cited

U.S. PATENT DOCUMENTS 6,952,253 B2   10/2005  Lof et al.
10,274,849 B2   4/2019  Queens et al.
(Continued)

FOREIGN PATENT DOCUMENTS

CN   102024467 A  *  4/2011
CN   104049468 A  *  9/2014 ......... G03F 7/70133
(Continued)

OTHER PUBLICATIONS

Office Action issued in corresponding Korean Patent Application No. 10-2022-7000199, dated May 21, 2024.
(Continued)

*Primary Examiner* — Lisa M Caputo
*Assistant Examiner* — Nyla Gavia
(74) *Attorney, Agent, or Firm* — Pillsbury Winthrop Shaw Pittman, LLP

(57) ABSTRACT

Apparatus and methods for determining a focus error for a lithographic apparatus and/or a difference between first and second metrology data. The first and/or second metrology data includes a plurality of values of a parameter relating to a substrate, the substrate including a plurality of fields including device topology. The apparatus may include a processor configured to execute computer program code to cause the processor to: determine an intra-field component of the parameter; remove the determined intra-field component from the first metrology data to obtain an inter-field component of the first metrology data; and determine the
(Continued)

difference between the first metrology data and second metrology data based on the inter-field component and the second metrology data.

20 Claims, 3 Drawing Sheets

(56) References Cited

U.S. PATENT DOCUMENTS

| | | | |
|---|---|---|---|
| 11,029,614 B2 | 6/2021 | Tel et al. | |
| 2003/0048458 A1* | 3/2003 | Mieher | G03F 7/70641 356/624 |
| 2003/0215965 A1* | 11/2003 | Grodnensky | G03F 7/70625 438/16 |
| 2008/0131796 A1* | 6/2008 | Werner | G03F 7/70641 430/30 |
| 2009/0325087 A1 | 12/2009 | Lyons | |
| 2011/0003256 A1* | 1/2011 | Van Der Heijden | G03F 7/70625 430/324 |
| 2012/0015460 A1* | 1/2012 | Donaher | G03F 7/70641 382/106 |
| 2016/0334712 A1 | 11/2016 | Cekli et al. | |
| 2018/0210351 A1 | 7/2018 | Queens et al. | |
| 2019/0258178 A1 | 8/2019 | Ten Berge et al. | |

FOREIGN PATENT DOCUMENTS

| | | | |
|---|---|---|---|
| EP | 3376290 A1 * | 9/2018 | |
| KR | 20180018810 | 2/2018 | |
| KR | 20190033591 | 3/2019 | |
| TW | 201527895 | 7/2015 | |
| WO | 2015104074 | 7/2015 | |
| WO | 2016128190 | 8/2016 | |
| WO | 2017012859 | 1/2017 | |
| WO | WO-2017012859 A1 * | 1/2017 | ......... G03F 7/70616 |
| WO | 2017144379 | 8/2017 | |
| WO | 2018019496 | 2/2018 | |
| WO | 2018025515 | 2/2018 | |
| WO | 2018065167 | 4/2018 | |
| WO | 2018086795 | 5/2018 | |

OTHER PUBLICATIONS

Office Action issued in corresponding Japanese Patent Application No. 2022-500023 dated Dec. 20, 2022.

Office Action issued in corresponding Chinese Patent Application No. 202080046768.6, dated Jan. 21, 2024.

International Search Report and Written Opinion issued in corresponding PCT Patent Application No. PCT/EP2020/065916, dated Oct. 20, 2020.

Taiwanese Office Action issued in corresponding Taiwanese Patent Application No. 109121291, dated Feb. 3, 2021.

Taiwanese Office Action issued in corresponding Taiwanese Patent Application No. 109121291, dated Apr. 6, 2021.

* cited by examiner

NON-CORRECTABLE ERROR IN METROLOGY

CROSS-REFERENCE TO RELATED APPLICATIONS

This application is the U.S. national phase entry of PCT Patent Application No. PCT/EP2020/065916 which was filed on Jun. 9, 2020, which claims the benefit of priority of European Patent Application No. 19184407.5 which was filed on Jul. 4, 2019 and of European Patent Application No. 19193962.8 which was filed on Aug. 28, 2019, each of which is incorporated herein in its entirety by reference.

FIELD

The present invention relates to methods and apparatus for determining all or part of a non-correctable error in metrology. More specifically, the invention may relate to determination of an offset between first and second metrology data.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD=k_1 \times \lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low $k_1$.

Lithographic apparatus focus the electromagnetic radiation onto the substrate in order to project the desired pattern. Determination of a focus error relating to the electromagnetic radiation is a means by which quality of the resulting ICs can be determined. Further, corrections for focus error may be applied within the lithographic apparatus in order to mitigate any adverse effects on IC quality.

When determining focus error, two principle sources of information may be used: data from a Levelling Sensor; and data from one or more metrology apparatus, which may use diffraction based techniques. Correlation between these two data sources is a factor in the accuracy with which focus error may be determined.

SUMMARY

According to the invention in an aspect, there is provided an apparatus for determining a difference between first and second metrology data comprising a plurality of values of a parameter relating to a substrate, the substrate including a plurality of fields comprising device topology, the apparatus comprising a processor configured to execute computer program code to undertake the method of: determining an intra-field component of the parameter; removing the determined intra-field component from the first metrology data to obtain an inter-field component of the first metrology data; and determining the difference between the first metrology data and second metrology data based on the inter-field component and the second metrology data.

Optionally, the first metrology data comprises data, $Z_{LS}$, obtained by a level sensor and relating to a height of the features fabricated on the substrate.

Optionally, the intra-field component comprises data relating to a topology of one or more devices in a field.

Optionally, determining the intra-field component is based on one or more algorithms, wherein the one or more algorithms take as inputs one or more features of the parameter.

Optionally, the one or more features of the parameter are measured by the or a further apparatus.

Optionally, the intra-field component is determined, at least in part, based on the first metrology data.

Optionally, the processor is further configured to control the apparatus to obtain the first metrology data.

Optionally, the plurality of values of the second metrology data have been measured from metrology targets fabricated in or on the substrate.

Optionally, the plurality of values of the second metrology data have been measured in scribe lanes between fields and/or dies on the substrate.

Optionally, the second metrology data comprises total focus error data obtained using diffraction based focus.

Optionally, determining the difference between the first and second metrology data comprises subtracting an actuated height, $Z_{EXP}$, of a wafer table in a lithographic exposure apparatus from the inter-field component to determine an estimate of a levelling non-correctable error based on the first metrology data.

Optionally, determining the difference between the first and second metrology data further comprises subtracting the estimated levelling non-correctable error based on the first metrology data from the second metrology data.

Optionally, the parameter comprises focus error.

Optionally, determining the difference between the first metrology data and second metrology data comprises subtracting known actuation profiles from the inter-field component of the first metrology data to obtain a scribe-lane specific expression of the first metrology data.

Optionally, determining the difference between the first metrology data and second metrology data further comprises determining a difference between the second metrology data and the scribe-lane specific expression of the first metrology data.

Optionally, the apparatus further comprises an apparatus for obtaining first metrology data and/or an apparatus for obtaining the second metrology data.

A lithographic apparatus comprising the apparatus of any of claims 1 to 16.

According to the invention in an aspect, there is provided a method for determining a difference between first and second metrology data comprising a plurality of values of a parameter relating to a substrate, the substrate including a plurality of fields comprising device topology, the method comprising: determining an intra-field component of the parameter; removing the determined intra-field component from the first metrology data to obtain an inter-field component of the first metrology data; and determining the difference between the first metrology data and second metrology data based on the inter-field component and the second metrology data.

According to the invention in an aspect, there is provided an apparatus for determining an estimate of scribe lane focus error contribution for a lithographic apparatus based on first and second metrology data, the first metrology data comprising a plurality of height values across a field of a substrate, the substrate including a plurality of fields comprising scribe lanes and dies including device topology, the second metrology data comprising a plurality of values of a parameter relating to a focus of the lithographic apparatus measured within the scribe lanes, the apparatus comprising a processor configured to execute computer program code to undertake the method of: determining an intra-field component of the first metrology data; removing the determined intra-field component from the first metrology data to obtain an inter-field component of the first metrology data; and determining a scribe lane focus error contribution of the first metrology as the difference between the inter-field component of the first metrology data and the measured or expected movements of the substrate due to actuation of the lithographic apparatus based on the first metrology data.

Optionally, the processor is further configured to remove the scribe lane focus error contribution of the first metrology from the second metrology data, to determine an estimate of focus error for the lithographic apparatus caused by effects not observed in the first metrology data.

Optionally, the processor is further configured to combine the first metrology data with the determined estimate of the focus error for the lithographic apparatus caused by effects not observed in the first metrology data.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
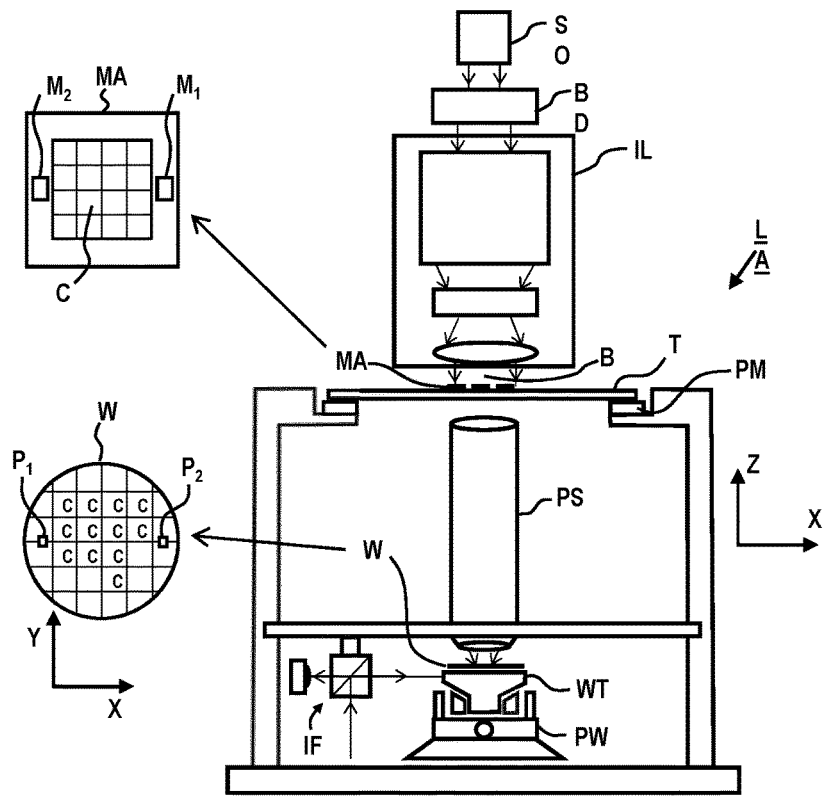
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) T constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support T, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

Figure 2:
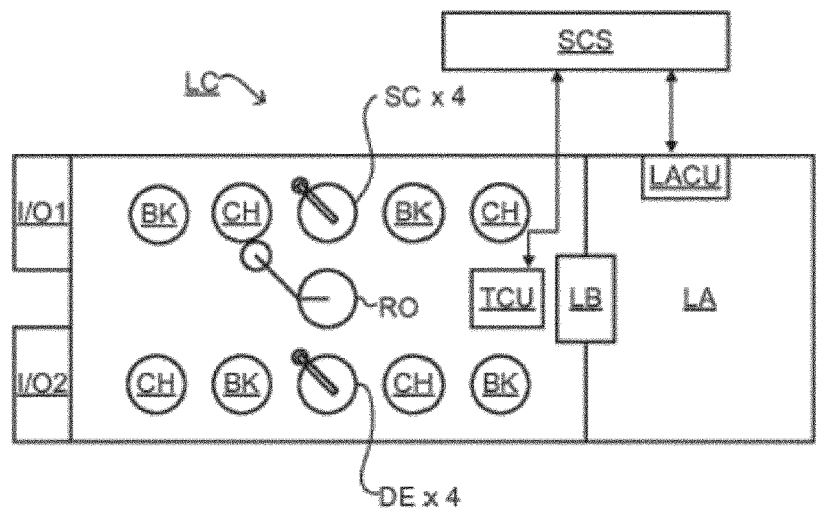
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), focus errors etc. For this purpose, inspection tools or metrology apparatus (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 3:
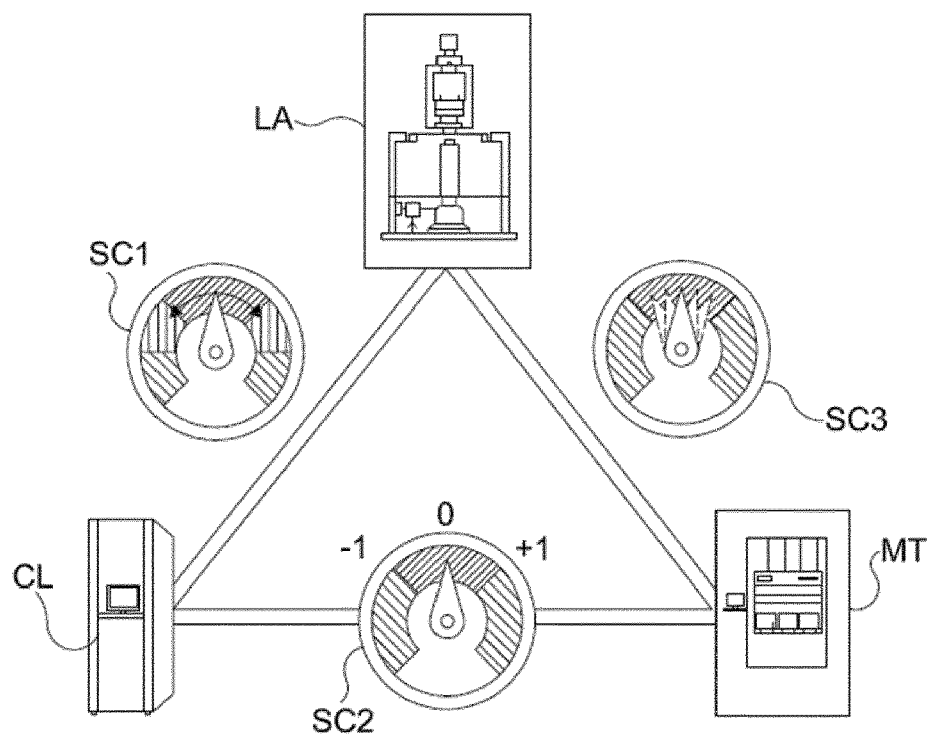
FIG. 3 depicts a schematic representation of holistic lithography, representing a cooperation between three key technologies to optimize semiconductor manufacturing.

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MT (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MT) to predict whether defects may be present due to e.g. sub-optimal processing (depicted in FIG. 3 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

The lithographic apparatus (or scanner) LA may include a levelling sensor that is not identified in the figures. Alternatively, the levelling sensor may be a separate apparatus within the track.

When imaging the pattern onto the substrate it is desirable to ensure that an uppermost surface of the substrate (i.e. the surface onto which the pattern is to be imaged) lies within the focal plane of the projection lens. Deviation of the position of the uppermost surface of the substrate from the focal plane of the projection lens may be termed focus error. The level sensor may be used to determine the position of the uppermost surface of the substrate. If the level sensor indicates that the uppermost surface of the substrate does not lie in the focal plane of the projection lens, the height of a substrate table bearing the substrate may be adjusted accordingly.

The level sensor may also be used to measure any slope that may be present in the surface of the substrate, the substrate table being tilted accordingly to correct the slope.

The level sensor may be part of a lithographic projection apparatus. As the tolerance to focus errors of features printed by lithographic apparatus becomes lower the accuracy of the determination of the focus error may become increasingly important.

The operation of a level sensor will be understood by the skilled person. However, broadly speaking, typical level sensors operate on reflectance of radiation incident on the substrate. Radiation is propagated through a slit and the resulting beam is scanned over the surface of the substrate. Radiation reflected from the surface of the substrate is detected and used to determine focus error.

As mentioned above, an inspection apparatus (or metrology apparatus) may be a stand-alone tool used to determine focus error in addition to measurements undertaken by a level sensor. Such inspection apparatus may use diffraction based techniques to determine the focus error, as will be understood by the skilled person. Broadly speaking, an inspection apparatus may direct radiation onto specific targets (or focus marks) fabricated on and/or in the substrate. Radiation that is diffracted by the targets is detected and used to determine focus error, which may be termed "total focus error". Typically, the targets are relatively sparsely positioned across the surface of the substrate and are located in scribe lanes, which are narrow channels between fields and/or dies of a substrate. As used herein, the term "field" encompasses a target portion as described above. A field may comprise one or more, typically a plurality, of "dies". In some arrangements, a die is typically associated with a specific semiconductor device (or chip) fabricated on the substrate. Scribe lanes and the targets may be positioned between fields and/or between dies.

When using an inspection apparatus, a "pure focus" value may be extracted from the total focus error. This can be done by subtracting from the total focus error known scanner contributors, which are mainly leveling non-correctable error (NCE) and in particular actuation errors brought about by the limitations with which movement of the wafer table is able to follow the upper surface of the substrate in case the surface demonstrates height variations along a direction of scanning at a spatial scale comparable to the slit length. The slit is exposed onto the substrate, typically covering an entire field width in x, and a few mm in y. A scanning motion in the y direction allows coverage over the field. As a result, only a linear profile can be actuated in the x-direction (assuming that the wafer stage is the only actuator, i.e. the image plane itself cannot be distorted) and a 'moving average' of the desired non-linear profile in the y-direction.

Said differently, pure focus can be defined as the unexpected focus error made across the substrate in addition to any expected focus errors based on the difference between scanner metrology (e.g. Level Sensor data) and scanner actuation potential.

Because the beam produced by the leveling sensor has propagated through a slit of finite length, it covers an area of the surface of the substrate. In some arrangements, the area covered by the level sensor beam is around 1.0 mm×2.5 mm. The level of the uppermost surface of the substrate determined by the leveling sensor therefore includes data across the area covered by the beam. In an exemplary case, the level determined by the level sensor is an average of the level of the uppermost surface across the area of the surface of the substrate covered by the beam. Therefore, the level of the scribe lanes that are located between the fields and/or dies containing device topology on the substrate is not captured well in the level determined by the leveling sensor, resulting in an offset, which is related to a scribe-to-cell offset, between the data obtained by the leveling sensor based on the device topology, and the data obtained by the inspection apparatus based on the targets fabricated in the scribe lanes.

Because the pure focus error is determined by subtracting focus error data derived from the leveling sensor from total focus error derived from the inspection apparatus, the scribe-to-cell offset, which may be defined as the local height difference between focus measurement marks in the scribe lane and the device topology in the fields, is present in the 'pure focus' fingerprint. The origin of the scribe-to-cell offset is because scribe lanes are processed differently compared to the device features in-die, or in-field. This leads in turn to different topology between in-die and in-scribe defocus.

On-product performance is increasingly being reconstructed from wafer maps of so-called NCEs, which are typically the difference between measure side inputs and what the lithographic apparatus could actuate. Such errors can be correlated to measurable signals, e.g. leveling NCE should contribute directly to focus errors as measured by the inspection apparatus. However, as discussed above, measurements in the inspection apparatus are often performed on small targets that are placed in a scribe lane rather than inside fields containing device topology. These scribe lanes are commonly too small to be visible in NCE maps that are determined by the leveling sensor, as explained above. Therefore, if the scribe lane height differs significantly from the height of the device topology, a so-called 'scribe-to-cell offset' reduces the correlation between the NCE maps determined from the leveling sensor data and the measurements obtained by the inspection apparatus. This is found to occur particularly in substrates with significant intra-field topography, notably 3D-NAND memory.

Figure 4:
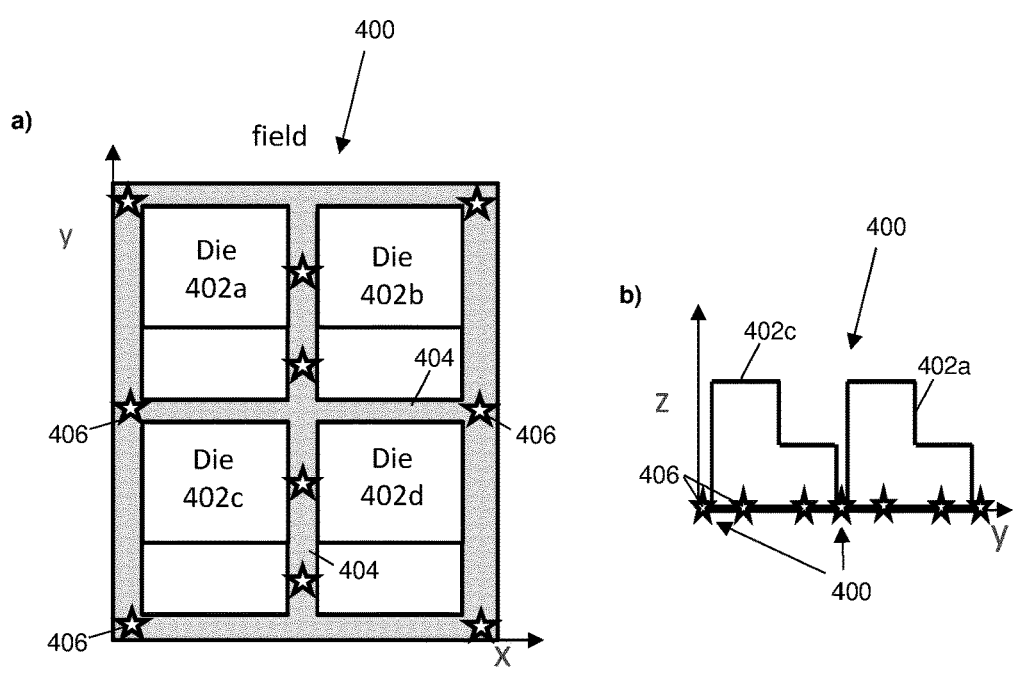
FIGS. 4a and 4b depict schematically a plan view and a side elevation respectively of a field of a substrate comprising dies and scribe lanes.

FIGS. 4a and 4b illustrate the discussion above. Part of a surface of a substrate 400 is shown in plan view in FIG. 4a and in section in FIG. 4b. The surface of the substrate comprises a plurality of dies 402a-d. Scribe lanes 404 run between the dies. A plurality of targets 406 are positioned in the scribe lanes 404 and are shown as stars in FIGS. 4a and 4b. The scribe-to-cell offset can be seen in FIG. 4b. It is noted that the scribe lanes in FIGS. 4a and 4b are shown larger than they would appear if FIGS. 4a and 4b were drawn to scale, for clarity. Typical dimensions for fields are actually around 26 mm×30 mm and typically scribe lane widths are actually typically around 50 μm.

Figure 5:
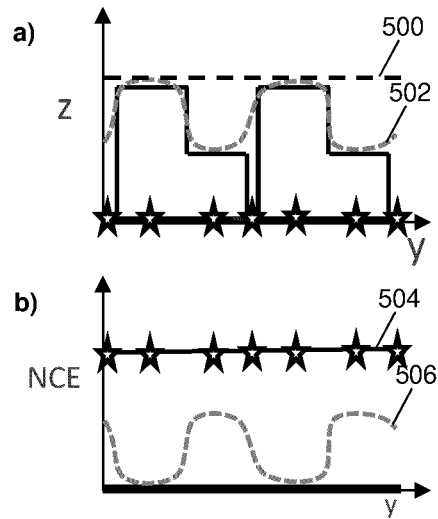
FIG. 5a depicts the side elevation of FIG. 4b with $Z_{exp}$ and $Z_{LS}$ overlaid.
FIG. 5b depicts a plot of non-correctable errors associated with a scribe lane and device topology.

FIG. 5a shows the section through the substrate as seen in FIG. 4b with the exposure height ($Z_{exp}$) 500 of the lithographic apparatus LA and the level of the surface of the substrate ($Z_{LS}$) 502 as measured by the level sensor overlaid.

As can be seen, $Z_{LS}$ 502 is a smoothed version of the actual topology of the substrate. This is a result of the averaging discussed above and related to the area covered by the beam in the level sensor. $Z_{exp}$ 500 is the height of exposure of the lithographic apparatus. The position of the wafer with respect to $Z_{exp}$ 500 is controlled by the actuated height of the wafer table.

FIG. 5b shows NCE values $NCE_{scribe}$ 504 and $NCE_{device}$ 506. $NCE_{device}$ 506 as shown in FIG. 5b is calculated by subtracting the exposure height $Z_{exp}$ 500 from the level sensor height $Z_{LS}$ 502:

$$NCE_{device} = Z_{LS} - Z_{exp}$$

Methods and apparatus disclosed herein may be configured to determine $NCE_{scribe}$, which is the non-correctable focus error induced in the scribe lanes by the limitations of focus control of the lithographic apparatus and/or the leveling sensor data.

Accordingly, methods and apparatus disclosed may be configured to determine a difference or offset between first metrology data (e.g. level sensor focus error data) and second metrology data (e.g. inspection apparatus focus error data). This may be done by determining $NCE_{scribe}$ from level sensor data.

Focus metrology, for example as obtained using an inspection apparatus using diffraction based techniques, is useful to deliver offsets to leveling sensor based focus control and monitoring focus behavior over time. The total focus budget comprises a number of components. The levelling sensor NCE is a large component. Projection lens focus error is an example of a focus budget contributor that is not picked up by the leveling sensor. The contribution of projection lens focus error may be measured by obtaining data from the targets in the scribe lanes, which are typically formed in the resist during the exposure of the wafer. In other arrangements, projection lens focus error may be measured using a dedicated image sensor.

However, the target is also formed at a non-zero focus due to the levelling sensor NCE, which is inevitably present during exposure. So the projection lens focus error is determined by subtracting the (independently measured) levelling sensor NCE from the focus mark based readout.

In a broader context, methods and apparatus disclosed herein may contribute to part of a metrology methodology that combines multiple sources of metrology data and pre-knowledge (physics, NCE, mask layout) to synthesize a high density, high accuracy map of (for example focus) parameter data. Methods and apparatus disclosed may fit within such methodologies as they combines multiple types of metrology data and pre-knowledge (e.g. an offset of the targets within the scribe lanes with respect to the product features making up the device).

Figure 6:
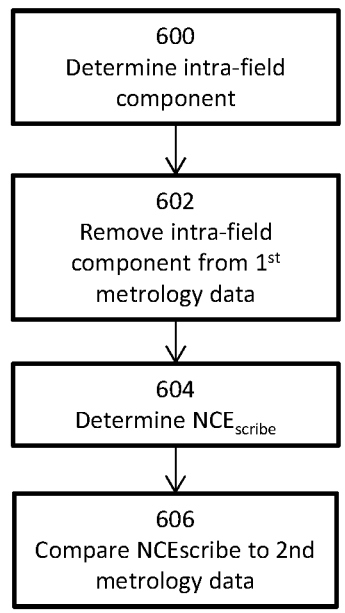
FIG. 6 depicts a flow diagram of a method for determining an offset between first and second metrology data.

FIG. 6 shows a flow diagram of an exemplary method for determining a difference, offset or correlation between first metrology data and second metrology data. Determining a difference, offset or correlation between the first metrology data may comprise determining a difference, offset or correlation between focus error data determined from the first metrology data (e.g. determined from level sensor data) and focus error data as determined from the second metrology data (e.g. determined from inspection apparatus data). In exemplary arrangements, the first metrology data comprises an inter-field component and an intra-field component.

In exemplary arrangements, the first metrology data may comprise $Z_{LS}$.

An intra-field component of the parameter is determined 600. The intra-field component is a component of the parameter that is seen within a field and/or die on the substrate. The intra-field component may repeat over a plurality of dies and/or fields on the substrate. In the case of leveling data that might be obtained from a leveling sensor, the intra-field component of the level data is the level of the topology within the field and/or die. This may be device topology.

The intra-field component of the parameter may be determined based on one or more algorithms. The algorithms may take as inputs one or more features of the parameter. For example, features of the parameter may comprise dimensions in one or more of X, Y and Z of device topology within the field. The algorithms may also include the dimensions of the slit of the level sensor, one or more parameters relating to the optical components for directing the radiation within the level sensor onto the substrate, and/or the area of the of the radiation beam incident on the substrate within the level sensor.

The algorithms for determining the intra-field component of the parameter may be known to the skilled person.

The determined intra-field component is removed 602 or subtracted from the first metrology data. This may leave the inter-field component.

$$Z_{LS,inter} = Z_{LS} - Z_{LS,intra}$$

The difference, offset or correlation between the first and second metrology data may now be determined based on the inter-field component $Z_{LS,inter}$ and the second metrology data. In the exemplary arrangement shown in FIG. 6, determining the difference, offset or correlation comprises determining 604 $NCE_{scribe}$ from the first metrology data.

$$NCE_{scribe} = Z_{LS,inter} - Z_{exp}$$

The determined $NCE_{scribe}$ is an estimate of the non-correctable focus error seen in the scribe lane due to errors induced by the lithographic apparatus. That is, the $NCE_{scribe}$ determined above is the non-correctable error determined by the leveling sensor with the scribe-to-cell offset removed. The determined $NCE_{scribe}$ may be compared 606 (e.g. by subtracting from) to the second metrology data and/or a value determined from the second metrology data. For example, the second metrology data may comprise data total focus measurement obtained from the inspection apparatus, optionally using diffraction based methods.

$NCE_{scribe}$ describes the contribution to defocus of the leveling sensor as seen at the sparsely positioned metrology target locations in the scribe lanes. This NCE may be subtracted from a focus error measurement to obtain a 'non-leveling' component of the focus error, sometimes referred to as 'pure focus'.

However, $NCE_{device}$ may still be the leveling NCE to take into account when describing focus performance in-device. In exemplary methods and apparatus disclosed herein, one might compute 'pure focus' by subtracting the scribe lane NCE ($NCE_{scribe}$) from the total focus measurement. The pure focus may be recombined intelligently with the device NCE to obtain the total expected defocus performance. An example of a recombination operation is the addition of pure focus and device NCE signals on a set of (x,y) locations on the substrate. A suitable mathematical interpolation operation may be used to obtain a representative value of the 'pure focus' and the 'device NCE' signals in locations that do not coincide with their respective measurement locations.

Further embodiments of the invention are disclosed in the list of numbered clauses below:

1. An apparatus for determining a difference between first and second metrology data comprising a plurality of values of a parameter relating to a substrate, the substrate including a plurality of fields comprising device topology, the apparatus comprising a processor configured to execute computer program code to undertake the method of:
    determining an intra-field component of the parameter;
    removing the determined intra-field component from the first metrology data to obtain an inter-field component of the first metrology data; and
    determining the difference between the first metrology data and second metrology data based on the inter-field component and the second metrology data.
2. An apparatus according to clause 1, wherein the first metrology data comprises data, $Z_{LS}$, obtained by a level sensor and relating to a height of the features fabricated on the substrate.
3. An apparatus according to clause 2, wherein the intra-field component comprises data relating to a topology of one or more devices in a field.
4. An apparatus according to clause 1 or 2, wherein determining the intra-field component is based on one or more algorithms, wherein the one or more algorithms take as inputs one or more features of the parameter.
5. An apparatus according to clause 4, wherein the one or more features of the parameter are measured by the or a further apparatus.
6. An apparatus according to any preceding clause, wherein the intra-field component is determined, at least in part, based on the first metrology data.
7. An apparatus according to any preceding clause, wherein the processor is further configured to control the apparatus to obtain the first metrology data.
8. An apparatus according to any preceding clause, wherein the plurality of values of the second metrology data have been measured from metrology targets fabricated in or on the substrate.
9. An apparatus according to clause 8, wherein the plurality of values of the second metrology data have been measured in scribe lanes between fields and/or dies on the substrate.
10. An apparatus according to any preceding clause, wherein the second metrology data comprises total focus error data obtained using diffraction based focus.
11. An apparatus according to any preceding clause, wherein determining the difference between the first and second metrology data comprises subtracting an actuated height, $Z_{EXP}$, of a wafer table in a lithographic exposure apparatus from the inter-field component to determine an estimate of a levelling non-correctable error based on the first metrology data.
12. An apparatus according to clause 11, wherein determining the difference between the first and second metrology data further comprises subtracting the estimated levelling non-correctable error based on the first metrology data from the second metrology data.
13. An apparatus according to any preceding clause, wherein the parameter comprises focus error.
14. An apparatus according to any preceding clause, wherein determining the difference between the first metrology data and second metrology data comprises subtracting known actuation profiles from the inter-field component of the first metrology data to obtain a scribe-lane specific expression of the first metrology data.
15. An apparatus according to clause 14, wherein determining the difference between the first metrology data and second metrology data further comprises determining a difference between the second metrology data and the scribe-lane specific expression of the first metrology data.
16. An apparatus according to any preceding clause, further comprising an apparatus for obtaining first metrology data and/or an apparatus for obtaining the second metrology data.
17. A lithographic apparatus comprising the apparatus of any of clauses 1 to 16.
18. A method for determining a difference between first and second metrology data comprising a plurality of values of a parameter relating to a substrate, the substrate including a plurality of fields comprising device topology, the method comprising:
    determining an intra-field component of the parameter;
    removing the determined intra-field component from the first metrology data to obtain an inter-field component of the first metrology data; and
    determining the difference between the first metrology data and second metrology data based on the inter-field component and the second metrology data.
19. An apparatus for determining an estimate of scribe lane focus error contribution for a lithographic apparatus based on first and second metrology data,
    the first metrology data comprising a plurality of height values across a field of a substrate, the substrate including a plurality of fields comprising scribe lanes and dies including device topology,
    the second metrology data comprising a plurality of values of a parameter relating to a focus of the lithographic apparatus measured within the scribe lanes,
    the apparatus comprising a processor configured to execute computer program code to undertake the method of:
    determining an intra-field component of the first metrology data;
    removing the determined intra-field component from the first metrology data to obtain an inter-field component of the first metrology data; and
    determining a scribe lane focus error contribution of the first metrology as the difference between the inter-field component of the first metrology data and the measured or expected movements of the substrate due to actuation of the lithographic apparatus based on the first metrology data.
20. The apparatus of clause 19, wherein the processor is further configured to remove the scribe lane focus error contribution of the first metrology from the second metrology data, to determine an estimate of focus error for the lithographic apparatus caused by effects not observed in the first metrology data.
21. The apparatus of clause 20, wherein the processor is further configured to combine the first metrology data with the determined estimate of the focus error for the lithographic apparatus caused by effects not observed in the first metrology data.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. An apparatus for determining a difference between first and second metrology data comprising a plurality of values of a parameter relating to a substrate, the substrate including a plurality of fields comprising device topology, the apparatus comprising computer program code and a processor configured to execute the computer program code to cause the processor to at least:
   determine an intra-field component of the parameter;
   remove the determined intra-field component from the first metrology data to obtain an inter-field component of the first metrology data;
   determine the difference between the first metrology data and second metrology data based on the inter-field component and the second metrology data; and
   configure a manufacturing process related to the substrate based on the determined difference and/or provide a signal representing, or based on, the determined difference to an apparatus for use by a tool or system in configuring a manufacturing process related to the substrate.

2. The apparatus according to claim 1, wherein the first metrology data comprises data obtained by a level sensor and relating to a height of features fabricated on the substrate.

3. The apparatus according to claim 2, wherein the intra-field component comprises data relating to a topology of one or more devices in a field.

4. The apparatus according to claim 1, wherein determination of the intra-field component is based on one or more algorithms that take as input one or more characteristics of the parameter.

5. The apparatus according to claim 4, wherein the one or more characteristics of the parameter are measured by the or a further apparatus.

6. The apparatus according to claim 1, wherein the intra-field component is determined, at least in part, based on the first metrology data.

7. The apparatus according to claim 1, wherein the plurality of values of the second metrology data have been measured from metrology targets fabricated in or on the substrate.

8. The apparatus according to claim 7, wherein the plurality of values of the second metrology data have been measured in scribe lanes between fields and/or dies on the substrate.

9. The apparatus according to claim 1, wherein determination of the difference between the first and second metrology data comprises subtraction of an actuated height of a substrate table in a lithographic exposure apparatus from the inter-field component to determine an estimate of a levelling non-correctable error based on the first metrology data.

10. The apparatus according to claim 9, wherein determination of the difference between the first and second metrology data further comprises subtraction of the estimated levelling non-correctable error based on the first metrology data from the second metrology data.

11. The apparatus according to claim 1, wherein the parameter comprises focus error.

12. The apparatus according to claim 1, wherein the determination of the difference between the first metrology data and second metrology data comprises subtraction of one or more known actuation profiles from the inter-field component of the first metrology data to obtain a scribe-lane specific expression of the first metrology data.

13. The apparatus according to claim 12, wherein determination of the difference between the first metrology data and second metrology data further comprises determination of a difference between the second metrology data and the scribe-lane specific expression of the first metrology data.

14. The apparatus according to claim 1, wherein the second metrology data comprises total focus error data obtained using diffraction based focus measurement.

15. The apparatus according to claim 1, further comprising an apparatus configured to obtain the first metrology data and/or an apparatus configured to obtain the second metrology data.

16. A method for determining a difference between first and second metrology data comprising a plurality of values of a parameter relating to a substrate, the substrate including a plurality of fields comprising device topology, the method comprising:
   determining an intra-field component of the parameter;
   removing the determined intra-field component from the first metrology data to obtain an inter-field component of the first metrology data;
   determining the difference between the first metrology data and second metrology data based on the inter-field component and the second metrology data; and
   configuring a manufacturing process related to the substrate based on the determined difference and/or providing a signal representing, or based on, the determined difference to an apparatus for use by a tool or system in configuring a manufacturing process related to the substrate.

17. The method according to claim 16, wherein the first metrology data comprises data obtained by a level sensor and relating to a height of features fabricated on the substrate and wherein the second metrology data comprises data measured from metrology targets fabricated in or on the substrate.

18. An apparatus for determining an estimate of scribe lane focus error contribution for a lithographic apparatus based on first and second metrology data, the first metrology data comprising a plurality of height values across a field of a substrate, the substrate including a plurality of fields comprising scribe lanes and dies including device topology, the second metrology data comprising a plurality of values of a parameter relating to a focus of the lithographic apparatus measured within the scribe lanes, the apparatus comprising computer program code and a processor configured to execute computer program code to cause the processor to at least:

determine an intra-field component of the first metrology data;

remove the determined intra-field component from the first metrology data to obtain an inter-field component of the first metrology data;

determine a scribe lane focus error contribution of the first metrology data as a difference between the inter-field component of the first metrology data and measured or expected movements of the substrate due to actuation of the lithographic apparatus based on the first metrology data; and configure a manufacturing process related to the substrate based on the determined scribe lane focus error contribution and/or provide a signal representing, or based on, the determined scribe lane focus error contribution to an apparatus for use by a tool or system in configuring a manufacturing process related to the substrate.

19. The apparatus according to claim 18, wherein the processor is further configured to remove the scribe lane focus error contribution of the first metrology data from the second metrology data, to determine an estimate of focus error for the lithographic apparatus caused by effects not observed in the first metrology data.

20. The apparatus according to claim 19, wherein the processor is further configured to combine the first metrology data with the determined estimate of the focus error for the lithographic apparatus caused by effects not observed in the first metrology data.

* * * * *